US006324486B1

(12) United States Patent
Crook et al.

(10) Patent No.: US 6,324,486 B1
(45) Date of Patent: Nov. 27, 2001

(54) METHOD AND APPARATUS FOR ADAPTIVELY LEARNING TEST ERROR SOURCES TO REDUCE THE TOTAL NUMBER OF TEST MEASUREMENTS REQUIRED IN REAL-TIME

(75) Inventors: David T. Crook; Steven K. List; Stephen P. Rozum, all of Loveland, CO (US); Eddie L. Williamson, Raleigh, NC (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/259,609

(22) Filed: Mar. 1, 1999

(51) Int. Cl.⁷ ............................. G01R 27/28; G01R 31/00
(52) U.S. Cl. ............................................ 702/117; 324/537
(58) Field of Search ........................... 702/117; 324/537, 324/555; 700/95, 109, 108

(56) References Cited

U.S. PATENT DOCUMENTS 5,202,639   4/1993   McKeon et al. .................... 324/537

OTHER PUBLICATIONS

Journal of Electronic Testing: Theory and Applications 9.9–18(1996), XP 000636621, "Selecting Measurements to Test the Functional Behavior of Analog Circuits", J. Van Spaandonk and T.A.M. Kevenaar, pp. 9–18.

Primary Examiner—Hal Wachsman
Assistant Examiner—Demetrius Pretlow (57) ABSTRACT

A method and system is presented for optimizing the number of required measurements to obtain in real-time by an automated tester that tests a device under test. During a test run, historical measurements are obtained and tracked. Each subsequent iteration the test attempts to re-measure the fewest number of measurements in real-time to obtain an accurate reflection of whether the device being tested passes or fails based on the real-time measurements and substituting historical measurements for those required measurements that were not taken in real-time.

20 Claims, 8 Drawing Sheets

*Prior Art*

METHOD AND APPARATUS FOR ADAPTIVELY LEARNING TEST ERROR SOURCES TO REDUCE THE TOTAL NUMBER OF TEST MEASUREMENTS REQUIRED IN REAL-TIME

FIELD OF THE INVENTION

The present invention pertains generally to automated testing techniques, and, more particularly, to a method for adaptively learning test error sources in an automated test system in order to reduce the number of measurements that are taken in real-time.

BACKGROUND OF THE INVENTION

Automated test equipment is used to perform a wide variety of tests that might otherwise be performed manually at a slower rate and/or greater cost. Automation of a test typically involves the reading of measurements from a device under test from which calculations are performed to determine whether the device under test is within or outside of acceptable test limits. For example, in the large-scale production of electronic circuits, automated test equipment is used for performing tests on each circuit board of a run of circuit boards. A run is a testing sequence of the same type of assembly with no intervening different types of assemblies. A typical automated circuit tester includes a test configuration circuit, a bed-of-nails fixture, and a set of programmable relay matrices and internal measurement busses. A circuit under test is positioned on the bed-of-nails fixture such that the nails electrically connect to nodes of the circuit under test. The measurement paths from the circuit under test to the test configuration circuit are connected by programming the appropriate relays in that path to close. While the relays in the measurement path are closing, the test configuration circuit is set up and prepared to take actual measurements. After the relays have closed, measurements are read from the circuit under test. Calculations are performed based on the measurements to determine whether the circuit under test passed the test.

In the prior art, automated testers obtain each required measurement in real-time-that is, each measurement that is required in the calculations that determine whether the test passed or failed are physically acquired on each test of a device under test that is part of the same test run. In many applications, however, several of the required measurements do not change significantly over time. This may be due to system-level error sources that generally remain constant for a particular test run. The taking of these stable error source measurements results in unnecessary test time overhead. Accordingly, a need exists for a method for reducing the number of real-time test measurements over a run of devices under test.

SUMMARY OF THE INVENTION

The improvements of the present invention over prior art automated testing techniques is achieved in several ways. First, the measurements required to compensate for error sources that do not change significantly between test runs or over time are measured and stored as historical measurements for use in calculating the component under test values in subsequent test runs. The measurements required to compensate for the error sources described above that do significantly change between test runs or over time are measured in real-time on a per test basis.

Secondly, since error source compensations differ on a per test basis, the measurements required to compensate for those error sources also differ on a per test basis. Therefore, the historical measurements that are measured and used for error compensation and test calculations are stored with each individual test.

Third, the stored historical measurements used for error compensation and test calculations are updated (i.e., re-measured and re-stored) on a periodic basis, first as they begin to affect the component under test value calculations and secondly as the physical number of times that those same stored historical measurements used in the component under test value calculations begin to increase over time.

Accordingly, the technique of the invention effectively adaptively learns the measurements and thus the error sources that do not change with time. By adaptively learning which measurements used in error source compensation do not change with time, and substituting historical values for those measurements, the number of measurements required to be taken in real-time is significantly reduced, and thus the speed of the test (i.e., its execution time) is significantly improved.

In accordance with the invention, the set of real-time measurements taken in real-time is reduced using an adaptive learning technique. First, a current set of real-time measurements is selected. The current set of real-time measurements is a subset of a full set of required measurements that are required to determine whether the test passes or fails. Once the current set of real-time measurements are selected, these measurements are measured from the circuit under test in real-time. Values of a current set of historical measurements comprising historical measurement values for each of the required measurements that are not included in the current set of real-time measurements are obtained. A determination is made, based on the current set of measured real-time measurements and the current set of historical measurements substituted for those required measurements that are not included in the current set of real-time measurements, as to whether said test passed or failed. If the test fails, a current retry set of real-time measurements comprising a subset of the required measurements different than the current set of real-time measurements is selected. The current retry set of real-time measurements is then measured in real-time. A current retry set of historical measurements comprising corresponding historical measurement values for each of the required measurements that are not included in the current retry set of real-time measurements is obtained, and a determination is made, based on the current retry set of measured real-time measurements and the current retry set of historical measurements substituted for those required measurements that are not included in the current retry set of real-time measurements, as to whether said test passed or failed.

In one embodiment, if the test fails using the current retry set of real-time measurements and current retry set of historical measurements, a next retry set of real-time measurements is selected and the test is reexecuted using these sets. This process may be repeated until either the test passes or the current retry set of real-time measurements comprises the full set of required measurements. If the test passes during a reexecution of the test, the corresponding historical measurement values of each of the current retry set of real-time measurements may be updated with the corresponding measured real-time measurements. In addition, if the test passes during a reexecution of the test, the current set of real-time measurements may be set to the current retry set of real-time measurements for use in testing the next circuit under test. An optional feature that may be performed if the test passes during reexecution of the test is reevaluating the current set of real-time measurements by determining a new set of real-time measurements and using the new set of real-time measurements as the current set of real-time measurements. Another optional feature that may be performed if the test passes during reexecution of the test is an audit function, in which the set of historical measurements is updated with current measurement values.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

The present invention describes an adaptive learning algorithm that optimizes the time required to perform an automated test by reducing the number of measurements that are taken in real-time. Although the illustrative embodiment is described in the context of an in-circuit test of an analog circuit on a PC board, it is to be understood that the invention applies to any automated test in which multiple measurements are required to determine whether the test passed or failed.

As used herein, the term "component under test" is to be understood to apply to an individual component of a circuit under test, or multiple components in the circuit under test extending up to the entire circuit under test itself. Required measurements are those measurements that are required for and used in the calculation of a component under test value. Real-time measurements are the subset of required measurements for which new readings are acquired for the purposes of calculating a component value. Historical measurements are measurements obtained from a previous reading of the same or similar component under test.

The present invention is described herein in the context of automated analog in-circuit testing (i.e., testing of the circuit assembly components that is performed while the circuit is unpowered). Analog in-circuit testing verifies proper electrical connections of the analog components on the printed circuit (PC) board by taking measurements of the analog values of the components as well as whether the analog component values are within specified tolerances. In large-scale production of electronic circuits, in-circuit testing is typically performed using a bed-of-nails fixture or robotic flying-prober. As known by those skilled in the art, a flying-prober is a set of probes that may be programmed to move, which replaces the bed-of-nails for measuring a particular component under test. The bed-of-nails fixture/robotic flying-prober probes the nodes on the printed circuit (PC) board that are associated with a particular component of the circuit that is currently under test, applies a set of stimuli, and takes measurements of the responses.

Figure 1:
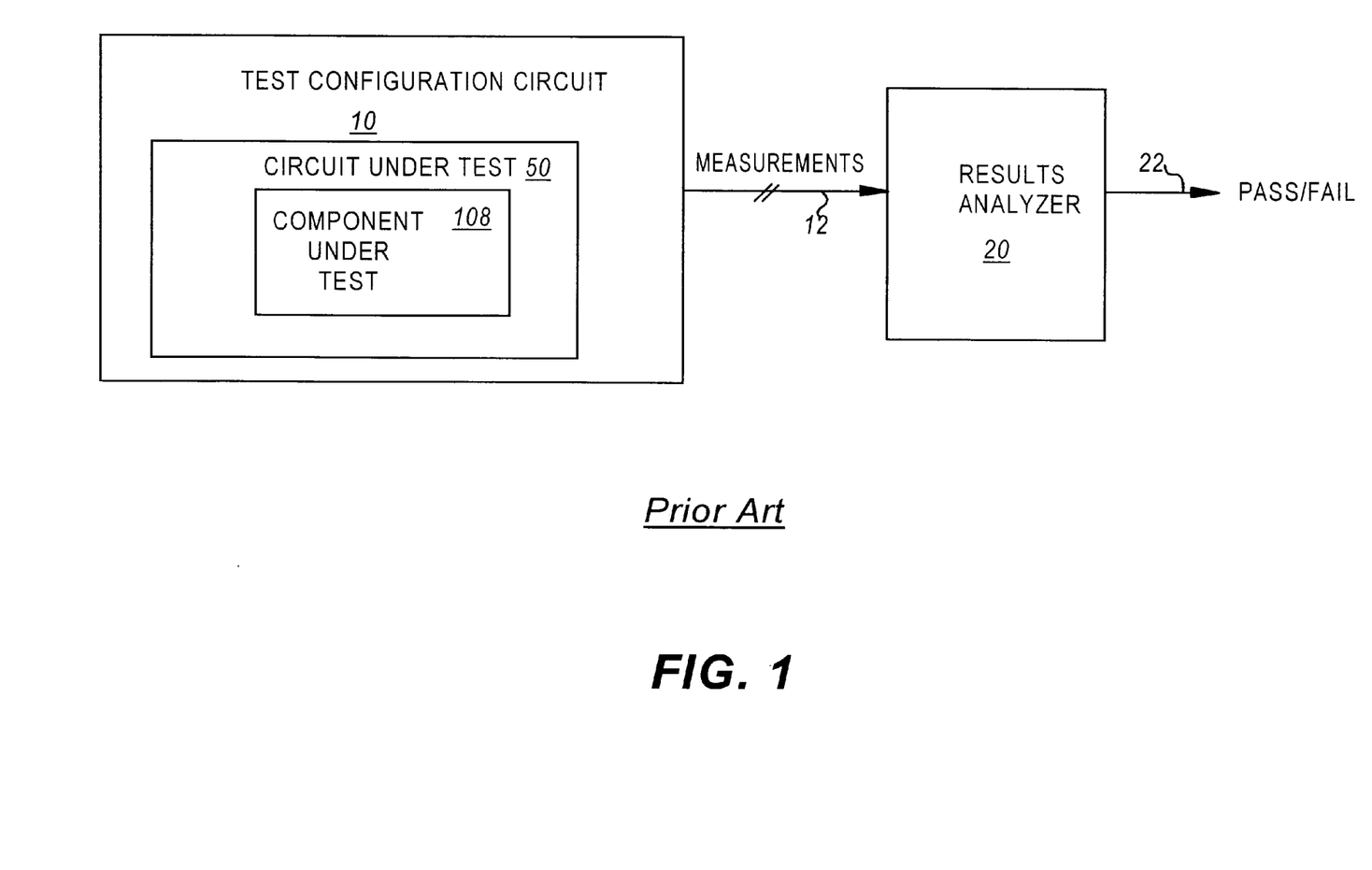
FIG. 1 is a block diagram of a prior art electronic test setup.

For a better understanding of the application of the invention to automated analog in-circuit testing, a description of analog in-circuit testing configurations is first presented. A typical analog in-circuit testing configuration, illustrated in FIG. 1, includes a test configuration circuit 10 that probes a component under test 108 and outputs a set of measurements 12 required for calculating a component value associated with the component under test 108. Using a bed-of-nails fixture that is connected to the test configure circuit 10, the nodes on the PC board associated with the component under test 108 are probed to connect the component under test 108 to the test configuration circuit 10. Component under test 108 measurements 12 are then made by applying a known voltage across the component under test 108 and measuring the resulting current using the test configuration circuit 10 as a current-to-voltage converter. A results analyzer 20 calculates the component value using the real-time measurements 12 for each of the required measurements needed to calculate the component value, and outputs an indication 22 of whether the component under test 108 passed (i.e., the calculated value was within specified tolerance levels) or failed (i.e., the calculated value was outside the specified tolerance levels).

Figure 2:
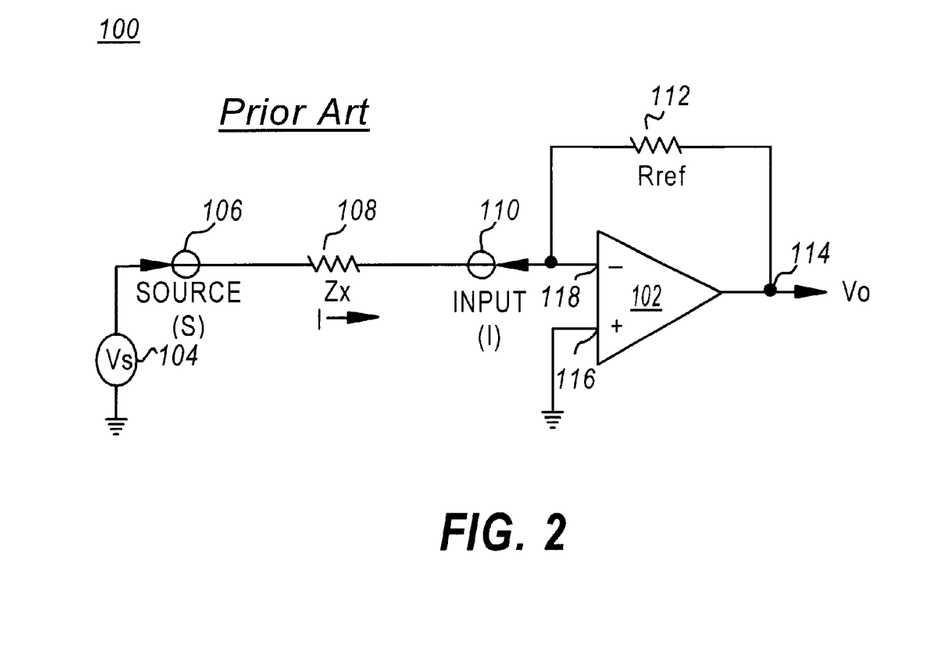
FIG. 2 is a prior art two-wire test configuration circuit.

FIG. 2 is one instance 100 of a prior art test configuration circuit 10. Test configuration circuit 100 is known as a "two-wire" measurement circuit. Test configuration circuit 100 includes operational amplifier (op-amp) 102 having a positive terminal 116 coupled to ground and a negative input terminal 118 coupled to an input node I 110. A reference resistor $R_{ref}$ 112 is coupled between input node I 110 and the output node $V_o$ 114 of op-amp 102. A component under test 108 having an unknown impedance $Z_x$ is coupled between input node I 110 and a source input node S 106 upon which a known reference voltage $V_s$ is delivered by a voltage stimulus source 104. Assuming an ideal op-amp circuit, test configuration circuit 100 assumes that the current through the unknown impedance $Z_x$ of the component under test 108 is equal to the current through reference resistor $R_{ref}$ 112 and that op-amp 102 maintains a virtual ground at negative input terminal 118. Thus, in an ideal op-amp circuit, theoretical impedance calculation is:

$$Z_x = -R_{ref}(V_s/V_o) \qquad \text{(Equation 1).}$$

The use of a precision DC voltage stimulus source 104 and a DC detector at output node $V_o$ 114 is employed to determine the resistive component of the output voltage when testing resistive analog components such as resistors. The use of a precision AC voltage stimulus source 104 and a phase synchronous detector at output node $V_o$ 114 is employed to determine the reactive components of the output voltage when testing reactive analog components such as capacitors and inductors.

Device measurements are complicated by printed circuit (PC) board topology configurations which introduce impedances in parallel with the component under test 108. The effects of these other devices connected in paths in parallel to the component under test 108 can cause errors in the basic measurement. As a result, testing components which are connected in a circuit on a PC board can require special measurement techniques such as guarding. Additionally, bed-of-nails fixture wiring and probes that are used to probe the nodes on the PC board for in-circuit measurements, system relays, and system busses that connect the component under test 108 into the test configuration circuit 100 also cause measurement problems. The bus wires represent impedances in series with the component under test 108. These are classes of lead impedance errors. Thermal electromagnetic forces (EMFs) of the system relays can appear as temperature-dependent voltage sources. The bimetallic contacts of a relay forms a basic thermocouple device. When these contacts are heated, either by current flow or via other heat sources with the system, a temperature dependent output voltage (i.e., a thermal offset) is generated. These are classes of voltage offset errors.

The errors sources described above can be categorized into three main types of error sources: (1) source voltage errors; (2) guarding errors; and (3) current measurement errors. Compensation techniques such as guarding and multi-wire measurements, which consist of active or passive sensing and or enhancement measurements, are used to compensate for the effects of these three types of error sources.

Figure 3:
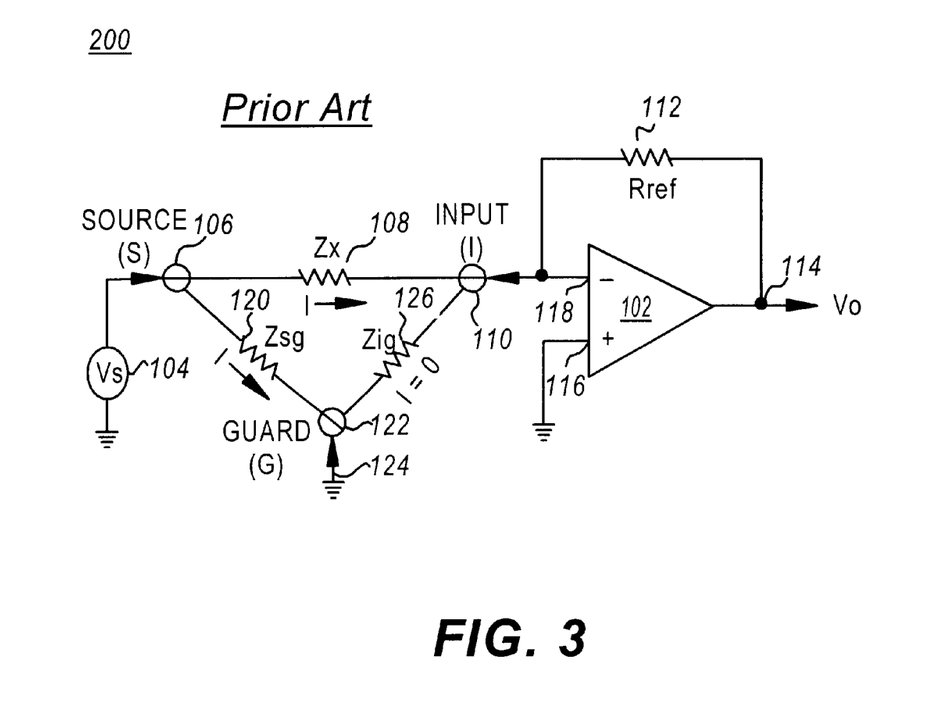
FIG. 3 is a prior art three-wire test configuration circuit.

FIG. 3 illustrates a prior art three-wire test measurement configuration circuit 200 that uses a guarding technique to break parallel resistance paths. Test configuration circuit 200 is similar to two-wire circuit 100 except that component under test 108 is shunted by a parallel impedance $Z_{sg}$ 120+$Z_{ig}$ 126 before guarding. The effect of the parallel path is reduced by connecting a guard bus 124 as shown in FIG. 3. Guard bus 124 is tied to test configuration circuit 200 ground, placing both ends of impedance $Z_{ig}$ at the same potential. Because there is no voltage drop across $Z_{ig}$, no current flows through impedance $Z_{ig}$ 126, thereby forcing all current from impedance $Z_x$ of component under test 108 to flow through reference resistor $R_{ref}$ 112. Therefore, the shunt components $Z_{sg}$ 120 and $Z_{ig}$ 126 do not affect the value measured for impedance $Z_x$ of component under test 108.

Figure 4:
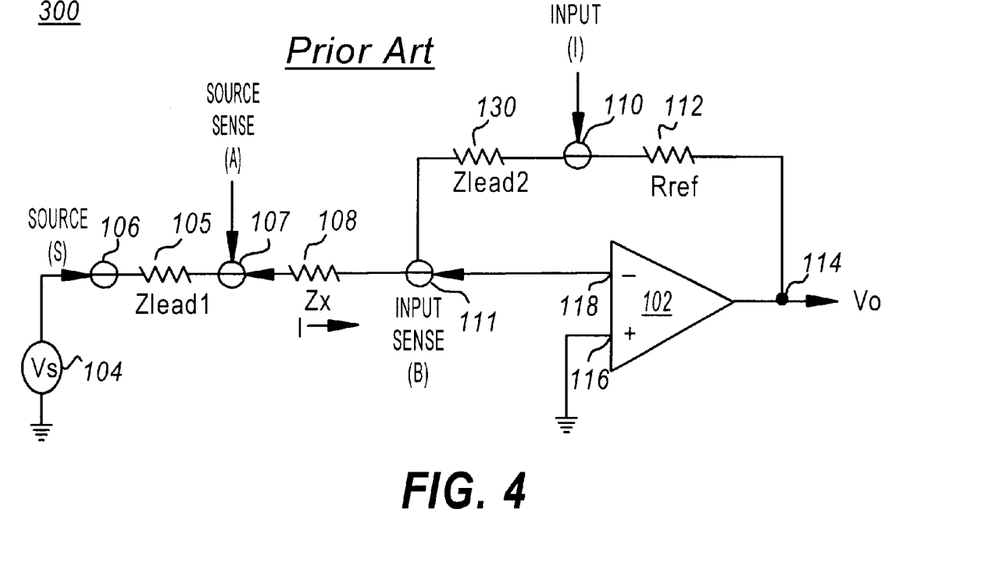
FIG. 4 is a prior art four-wire test configuration circuit.

When low-impedance components are measured, lead impedances in the two measuring busses (i.e. Source bus S 106 and Input bus I 110) can affect the measured result. To compensate for lead impedance, four-wire measurements can be made on the component under test 108. This technique is illustrated in FIG. 4 by prior art four-wire test configuration circuit 300. Test configuration circuit 300 is similar to two-wire circuit 100, except that voltage measurements are taken directly across the component under test 108 at source sense node A 107 and input sense node B 111, and also across reference resistor $R_{ref}$ 112 at input sense node I 110 and output node $V_o$ 114. This eliminates the effect of lead impedances $Z_{lead1}$ 105 and $Z_{lead2}$ 130 and other effects caused by fixture impedance, relay impedance, and other test configuration circuit internal impedances.

Figure 5:
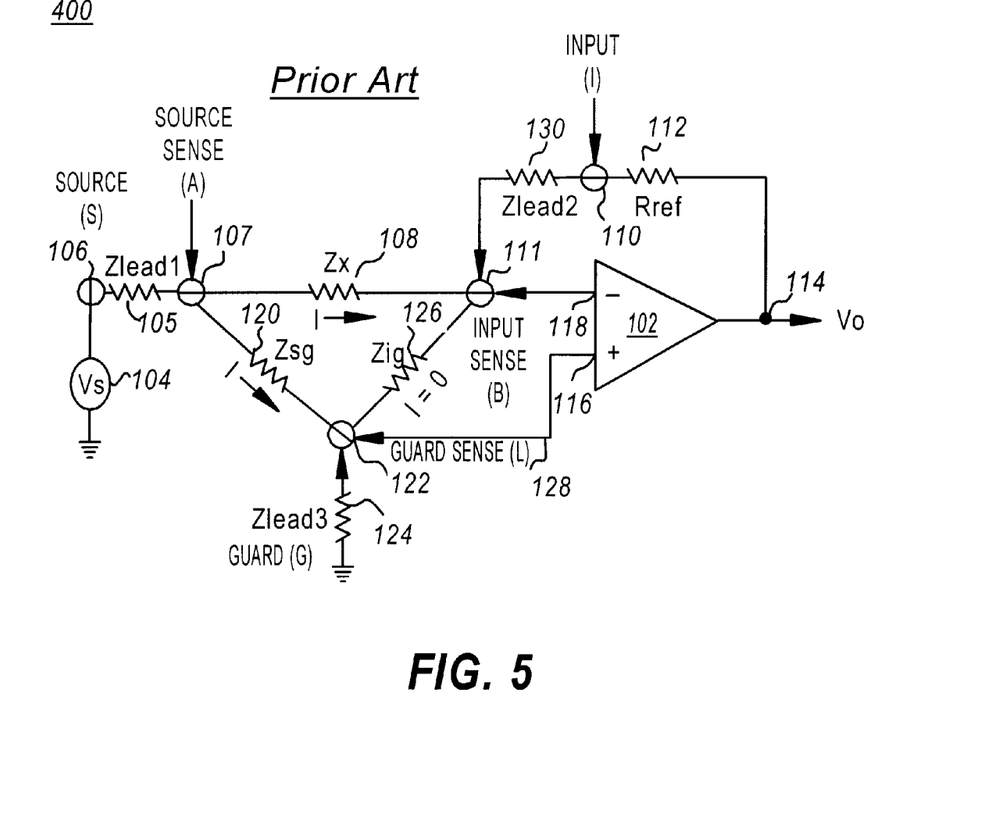
FIG. 5 is a prior art six-wire test configuration circuit.

Four-wire measurements in four-wire circuit 300 are not sufficient to eliminate the current through impedance $Z_{ig}$ 126 shown in FIG. 5. This is the case when the impedance of the parallel path $Z_{sg}+Z_{ig}$ becomes significantly smaller than the impedance $Z_x$ for the component under test 108. A large current through $Z_{sg}$ 120, shown in FIG. 5, causes an error voltage across guard bus 124 (shown in FIG. 5) which produces an error current through $Z_{ig}$ 126. The resulting errors limit the range of components and circuit configurations that can be successfully tested with three-wire guarding and four-wire measurements. These errors can be minimized, as shown in FIG. 5, by using source sense node A 107, input sense node B 111, and an additional guard sense bus L 128, and taking the additional voltage measurements previously mentioned, similar to the four-wire measurements.

Presently, resistor test results are enhanced by making eight measurements in order to compensate for the previously described error sources. The eight measurements include measurements of voltages of source sense node A 107, input sense node B 111, input node I 110, and output node $V_o$ 114, each measured once with the power source $V_s$ 104 on and then again with the power source $V_s$ 104 off. The resulting measurements are sent to a results analyzer 20 which uses the measurements and calculates the actual voltage applied to the component under test 108, the actual voltage across the reference resistor $R_{REF}$ 112, and uses the actual calibrated reference resistor value to calculate the actual impedance value $Z_x$ for component under test 108. Refer to Equation 1.

Enhanced capacitor tests use the exact same circuit setup, but use an AC source for $V_s$ 104, and a phase synchronous detector to make twelve measurements in order to compensate for system errors. The twelve measurements include a real measurement, a positive imaginary measurement, and a negative imaginary measurement on each of the four nodes A 107, B 111, I 110 and $V_o$ 114. The resulting measurements are sent to the results analyzer 20 which uses the measurements and calculates the actual real and imaginary components of the voltage across reference resistor $R_{ref}$ 112 and uses the actual reference resistor value $R_{ref}$ to calculate the actual capacitance of component under test 108.

In the prior art, all measurements required to calculate the value of a component under test 108 are made in real time, i.e., the measurements are made each time the component under test 108 is tested, for each iteration of the test of the PC board in order to compensate for measurement error sources. The additional guard sensing and multi-wire measurements of the component under test 108 as described in the test configurations of FIGS. 3–5 allow the component values of the component under test 108 to be measured with very high accuracy. However, these additional measurements take additional testing time. This additional test time required to remove the error sources effectively slows down the testing of a run of identical-type PC boards.

Some of the error sources that enhanced measurements attempt to compensate for are voltage stimulus source errors, guard offset errors (or guard gain errors), and current splitting errors. These error sources can be caused by PC board topologies, relay contact resistance, probing contact resistance and thermal offsets (due to temperature variations within the specified +/−5 degree C Autoadjust band), among others. Many of the error sources just described do not change significantly over time or between tests of the PC board. Voltage stimulus source errors due to the PC board topology, for example, do not change over time. Also, if temperature remains constant, then that error source will not change over time. In the illustrative example, the present invention is applied to improve the overall testing times of analog components under test on a PC board in production testing over prior art techniques by taking advantage of the fact that some error sources do not change over time. In the past, this has not been done because the source of the error has not been easily or readily identifiable.

According to the invention, a subset smaller than the full set of required measurements is taken, if possible, to calculate the component under test 108 value and determine whether the component under test 108 passes as determined by the results analyzer 20. In the event of a failed test as determined by the results analyzer 20, a "retry on failure" is performed, meaning that additional and/or different real-time measurements for the component under test 108 are taken and the component under test 108 value is recalculated by the results analyzer 20 to determine whether the test passes on retry.

Figure 6A:
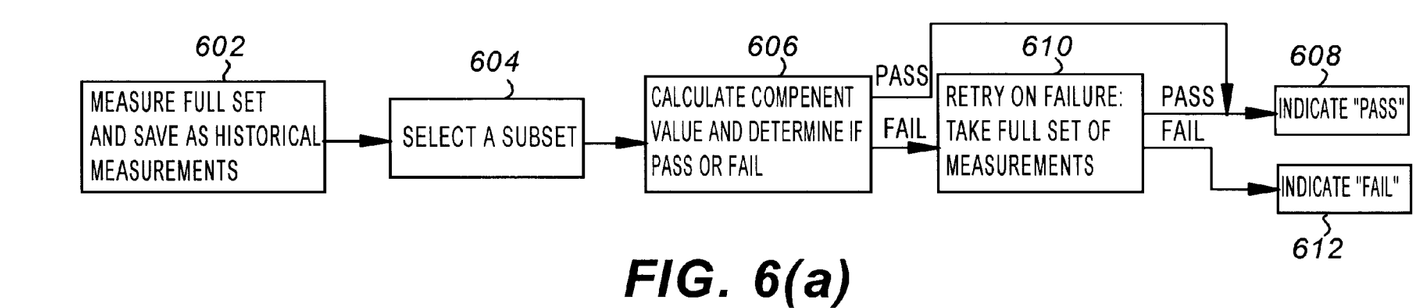
FIG. 6(a) is an operational flowchart of one embodiment of the method of the invention.
Figure 6B:
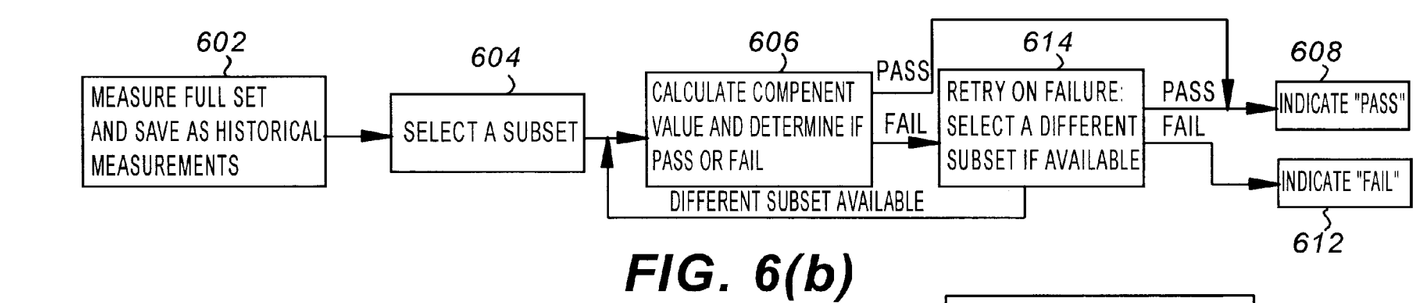
FIG. 6(b) is an operational flowchart of another embodiment of the method of the invention.
Figure 6C:
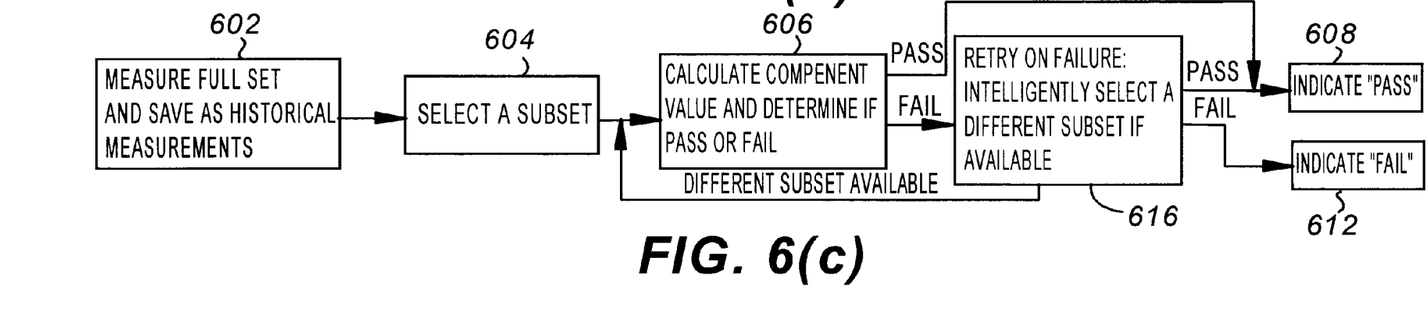
FIG. 6(c) is an operational flowchart of yet another embodiment of the method of the invention.

The operation of the invention is illustrated by the flowcharts shown in FIGS. 6(a)–6(c). The most rudimentary form of the invention is shown in FIG. 6(a). In this embodiment, a full set of measurements for the component under test 108 are taken 602 and saved as the historical measurements. On each run of the test, a subset of the full set of required measurements is selected and measured in real-time 604. The component under test 108 value is calculated 606 using the subset of real-time measurements, substituting the historical measurements for those measurements that are part of the full set of required measurements but not included in the selected subset of real-time measurements. If the test passes, a "pass" is indicated 608. If the test fails, a retry on failure 610 is performed. In this embodiment, the retry on failure generally includes re-measuring the full set of measurements for the component under test 108 to calculate the component value and determine whether the component under test 108 passes or fails. If the test passes, a "pass" is indicated 608; if the test fails, a "fail" is indicated 612.

An alternative embodiment of the invention is shown in FIG. 6(b). In this embodiment, a full set of required measurements for the component under test 108 are taken 602 and saved as the historical measurements. On each execution of the test, a subset of the full set of required measurements is selected and measured in real-time 604. The component under test 108 value is calculated 606 using the subset of real-time measurements, substituting the historical measurements for those measurements that are part of the full set of measurements but not included in the selected subset of real-time measurements. If the test passes, a "pass" is indicated 608. If the test fails, a retry on failure 614 is performed. In this embodiment, the retry on failure includes selecting a different subset, if available, of the full set of measurements to measure in real-time for the component under test 108 and measuring the new subset of real-time measurements in real-time. The component under test 108 value is calculated 606 using the new subset of real-time measurements, substituting the historical measurements for those measurements that are part of the full set of measurements but not included in the new subset of real-time measurements. If the test passes, a "pass" is indicated 608; if the test fails, steps 614 and 606 may be repeated with another subset of the full set of real-time measurements. If the current subset of real-time measurements includes the full set of measurements and the test still fails, a "fail" is indicated 612.

In a more sophisticated embodiment of the invention, as shown in FIG. 6(c), intelligence is added to the selection process during a retry on failure. In this embodiment, a full set of required measurements for the component under test 108 are taken 602 and saved as the historical measurements. On each execution of the test, a subset of the full set of measurements is selected and measured in real-time 604. The component under test 108 value is calculated 606 using the subset of real-time measurements, substituting the historical measurements for those measurements that are part of the full set of measurements but not included in the selected subset of real-time measurements. If the test passes, a "pass" is indicated 608. If the test fails, a retry on failure 616 is performed. In this embodiment, the retry on failure includes intelligently selecting a different subset, if available, of the full set of measurements to measure in real-time for the component under test 108 and measuring the new subset of real-time measurements in real-time. Intelligent selection may include selecting a certain combination of measurements that are particular to a certain error source that is known to be problematic in the test configuration. In the preferred embodiment, discussed in detail hereinafter, the subset of real-time measurements is selected according to the minimum set of measurements that need be taken in real-time without incurring "false failures". The component under test 108 value is calculated 606 using the new subset of real-time measurements, substituting the historical measurements for those measurements that are part of the full set of measurements but not included in the new subset of real-time measurements. If the test passes, a "pass" is indicated 608; if the test fails, steps 614 and 606 may be repeated, intelligently selecting another subset of the full set of real-time measurements. If the current subset of real-time measurements includes the full set of measurements and the test still fails, a "fail" is indicated 612.

According to the preferred embodiment of the invention, the fewest number of real-time measurements are taken to calculate the component under test 108 value and determine if that component under test 108 is a passing test as determined by the results analyzer 20. The measurement values used to compensate for error sources and calculate the component under test 108 are configured to adapt to error sources as they manifest themselves in the form of "false failures". A history of each measurement required to compensate for error sources and calculate the component under test 108 value (thus determining pass/fail information), is created upon the first run of the test. The value(s) of each of the measurements are maintained as the historical measurements and also maintained for that particular component under test 108. Once an historical measurement is obtained for each of the required measurements for testing a component under test 108, each subsequent run of the test attempts to use the historical measurements in conjunction with the fewest number of real-time measurements to obtain an accurate reflection of whether the component under test 108 passes or fails. In the preferred embodiment of the invention this is accomplished by measuring only the output voltage of the test configuration circuit 10 in real-time and by replacing the remaining measurements used in the calculation for the component under test 108 with the historical measurements obtained for that particular component under test 108. This is the normal mode of operation until a failure is detected in the results analyzer 20. If at any time a "false failure" occurs, (i.e., the calculation of the component under test 108 fails when a combination of real-time measurements and historical measurements are used in the test calculations but the calculation results pass when all of the required measurements used in the calculation are taken in real-time), then, via additional processing, it is determined which other measurements in test configuration circuit 10 must be taken in real-time to compensate for the error source that caused the "false failure".

In the preferred embodiment, the algorithm used to determine the additional real-time measurements that must be made begins with combining a minimal set of real-time measurements (e.g., two) with the historical measurements to compensate for error sources and calculate the value of the component under test 108. The result of the calculations from each combination of real-time measurements and historical measurements is compared with the calculated result that was just obtained using all of the real-time measurements. The minimal set of real-time measurements that, when combined with the historical measurements in the calculations of the device under test 108, (a) result in a passing device test, and (b) result in the smallest deviation from the actual results obtained using all of the real-time measurements, is then used as the new current set of real-time measurements that must be taken on a per run basis.

If all combinations of the minimal set of real-time measurements combined with the historical measurements have been exhausted before the above requirements have been met, then the minimal set of real-time measurements is expanded by one (e.g., three). This new minimal set of real-time measurements is then used to repeat the algorithm.

The process is repeated until a set of real-time measurements (combined with the historical measurements) is found that will satisfy the conditions (a) and (b) above, or the set of real-time measurements includes all of the real-time measurements. Once the minimal set of real-time measurements has been determined, the set is maintained for that component under test 108. Thus, each component under test 108 that is tested could have a different minimal set of real-time measurements. This minimal set is also used as input to the algorithm should another "false failure" occur. If, after re-measuring all the real-time measurements, the results analyzer 20 indicates a failing device, the component under test 108 is determined to be a "real" failure and the pass/fail indicator will indicate a failure.

Figure 7:
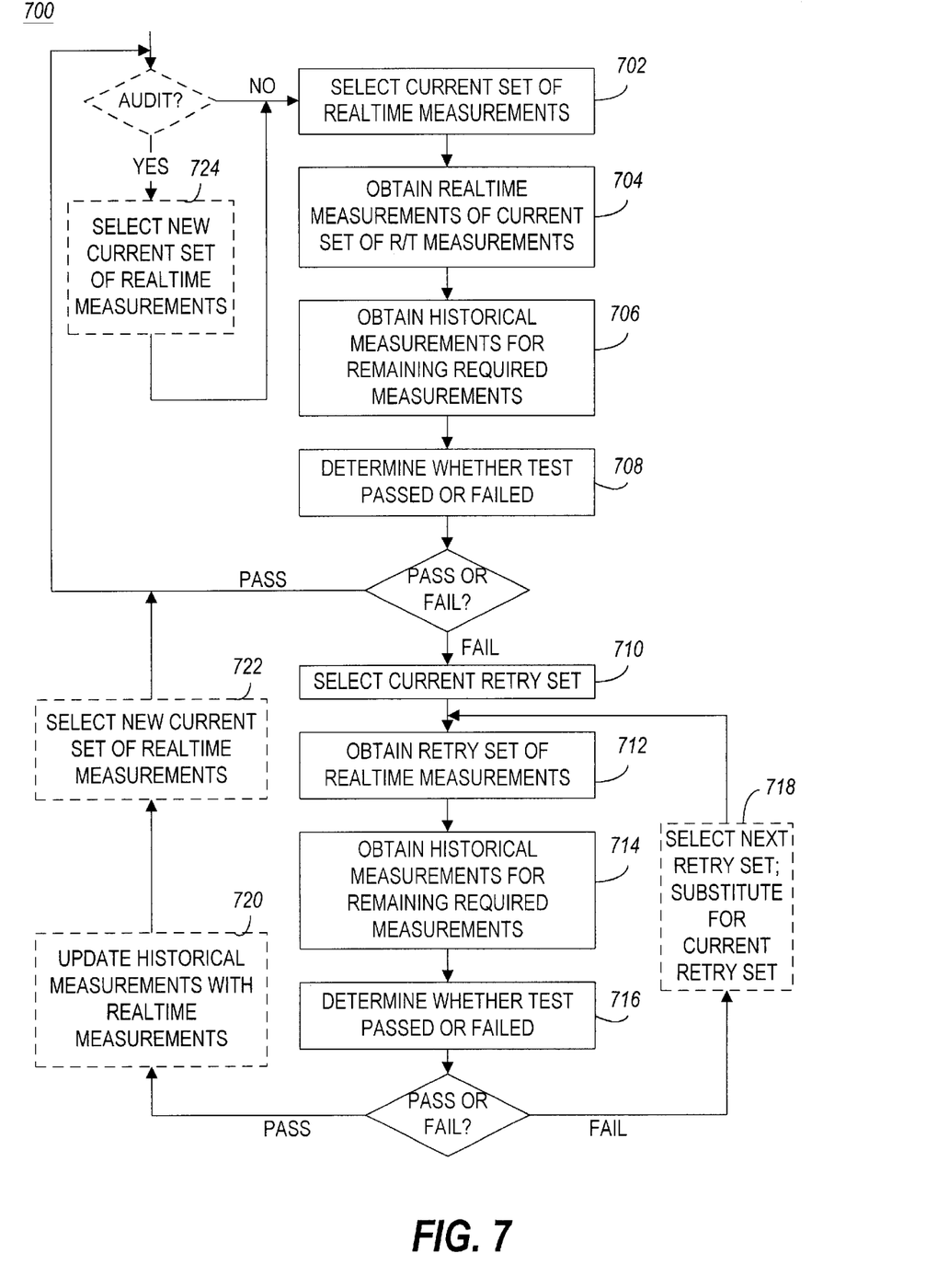
FIG. 7 is a flowchart of the adaptive learning algorithm of the invention.

FIG. 7 is a flowchart illustrating the adaptive learning process of the invention. As shown, a current set of real-time measurements is selected 702. The current set of real-time measurements may be selected by a test engineer and stored for use by the automated tester for the current test run, or may be determined according to any optimization algorithm to obtain a minimal optimized set prior to the first pass of the test run. The current set of real-time measurements is a subset of a full set of required measurements that are required to determine whether the test passes or fails. Once the current set of real-time measurements are selected, these measurements are measured 704 from the circuit under test in real-time. Values of a current set of historical measurements comprising historical measurement values for each of the required measurements that are not included in the current set of real-time measurements are obtained 706. A determination is made 708, based on the current set of measured real-time measurements and the current set of historical measurements substituted for those required measurements that are not included in the current set of real-time measurements, as to whether said test passed or failed. If the test passes, the pass status of the test is indicated and the test is complete. If the test fails, a current retry set of real-time measurements comprising a subset of the required measurements different that the current set of real-time measurements is selected 710. The current retry set of real-time measurements is then measured 712 in real-time. A current retry set of historical measurements comprising corresponding historical measurement values for each of the required measurements that are not included in the current retry set of real-time measurements is obtained 714. A determination is made 716, based on the current retry set of measured real-time measurements and the current retry set of historical measurements substituted for those required measurements that are not included in the current retry set of real-time measurements, as to whether said test passed or failed. In one embodiment, the current retry set of real-time measurements is the full set of required measurements. Thus, if the test fails during reexecution of the test the failure is known to be a true failure.

In one embodiment, if the test fails using the current retry set of real-time measurements and current retry set of historical measurements, a next retry set of real-time measurements is selected 718 and the retry branch (steps 710 through 716) is reexecuted using the next retry set of real-time measurements in place of the current retry set of real-time measurements and wherein the current set of historical measurements is the subset of required measurements not included in the next retry set of real-time measurements. This process may be repeated until either the test passes or the current retry set of real-time measurements comprises the full set of required measurements. If the test passes during a reexecution of the test, the corresponding historical measurement values of each of the current retry set of real-time measurements may be updated 720 with the corresponding measured real-time measurements. In addition, if the test passes during a reexecution of the test, a new current set of real-time measurements may be selected and set 722. This new current set of real-time measurements may be the current retry set of real-time measurements, or may be otherwise selected using an optimization algorithm. The new current set of real-time measurements is then used as the current set of real-time measurements in testing the next circuit under test. Another optional feature that may be performed if the test passes during reexecution of the test is an audit function 724, which includes reevaluating the current set of real-time measurements by determining a new set of real-time measurements and using the new set of real-time measurements as the current set of real-time measurements.

Figure 8:
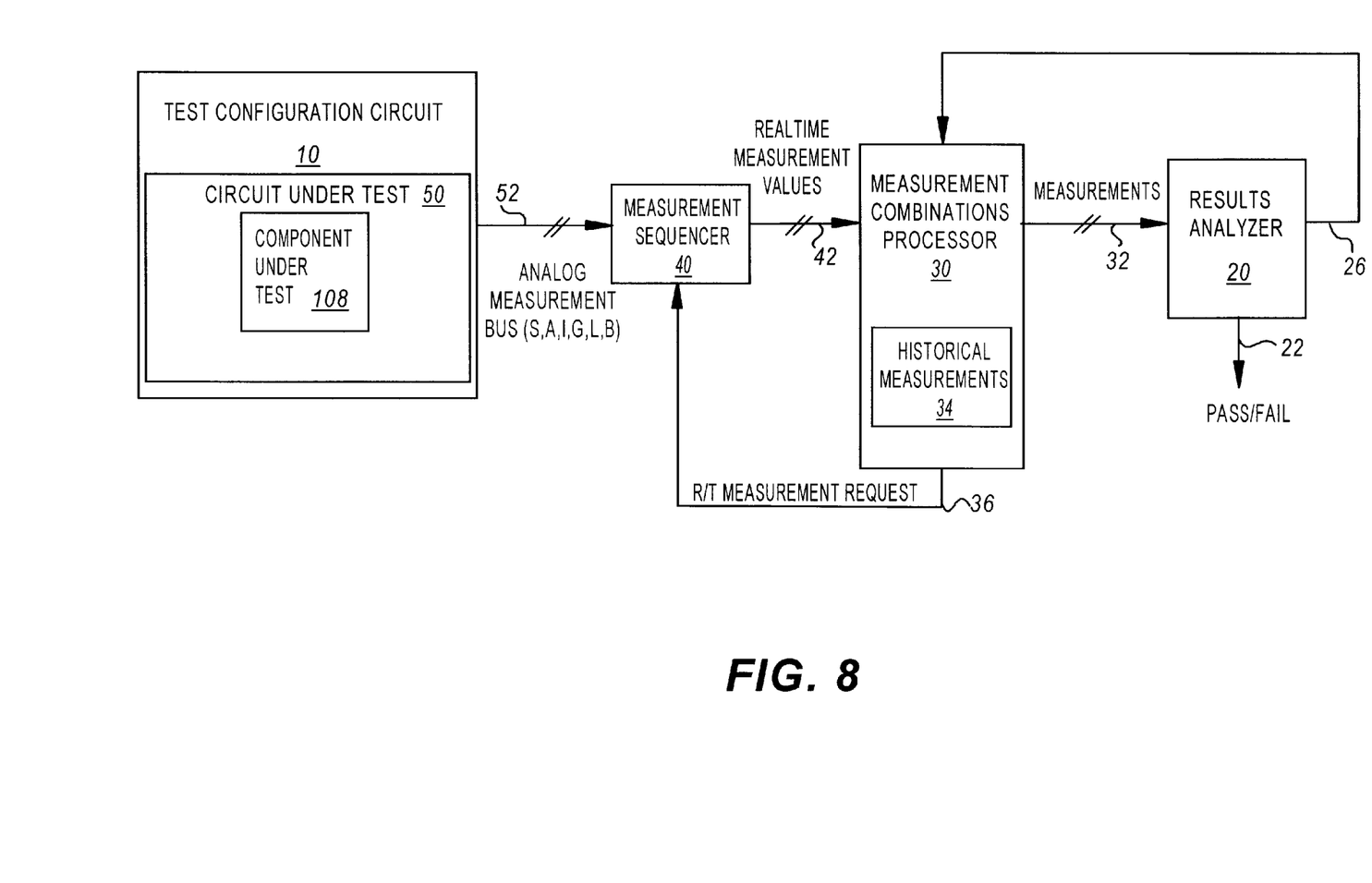
FIG. 8 is a block diagram of an electronic test setup implemented in accordance with the invention.

FIG. 8 is a block diagram of an example test setup in accordance with the invention. The test setup includes test configuration circuit 10 which connects to nodes on a circuit under test 50 to obtain measurement values for component under test 108. Test configuration circuit 10 sends all measurements for the component under test 108 over analog measurement bus 52 to measurement sequencer 40, typically implemented using an analog-to-digital (A/D) converter. Measurement sequencer 40 is responsive to measurement value requests 36 to output only those measurement values 42 requested from the full set of measurements received on bus 52. The test setup includes a measurement combination processor 30. Measurement combination processor 30 maintains historical measurement values 34 for each measurement required by results analyzer 20 in calculating the component under test 108 value. Measurement combination processor 30 also determines the set of real-time measurements 36 which will result in an accurate reflection of the whether the component under test 108 passed. Measurement combination processor 30 sends a request 36 for the set of real-time measurements to be taken to measurement sequencer 40, receives the requested real-time measurement values 42, and sends the combination 32 of real-time measurement values 42 and substituted historical measurement values 34 for those measurements not included in the set of real-time measurements to results analyzer 20. Results analyzer 20 calculates the component under test 108 value based on the received combination 32 of real-time measurements 42 and historical measurements 34. Results analyzer 20 outputs passing device information via indicator 22 and also 26, should the component value pass. Measurement combination processor 30 receives the pass/fail indicator 26 of results analyzer 20 and, if the calculated component value failed, as indicated by a failure indicator on output 26, measurement combination processor 30 requests 36 a new set of real-time measurements, which may include all, or a subset of all, the measurements required to compensate for the error sources (and thus calculate the component under test 108 value). The measurement combination processor 30 receives the requested real-time measurement values 42, and sends the combination 32 of real-time measurement values 42 and historical measurement values 34 (if any) substituted for any of the full set of measurements not included in the new set of real-time measurements 42, to the results analyzer 20 to re-calculate the component under test 108 value using the combination 32 of new real-time measurements 42 and substituted historical measurement values 34. At this time, the results of the re-calculated component under test 108 value are output via pass/fail indicator 22 and 26. Results analyzer 20 outputs a pass indicator on output 22 on the earliest detection that the component passed. A failure indicator is not output on output 22 until results analyzer 20 determines that the component value calculated cannot be a result of error sources inherent in the measuring circuitry.

Figure 9A:
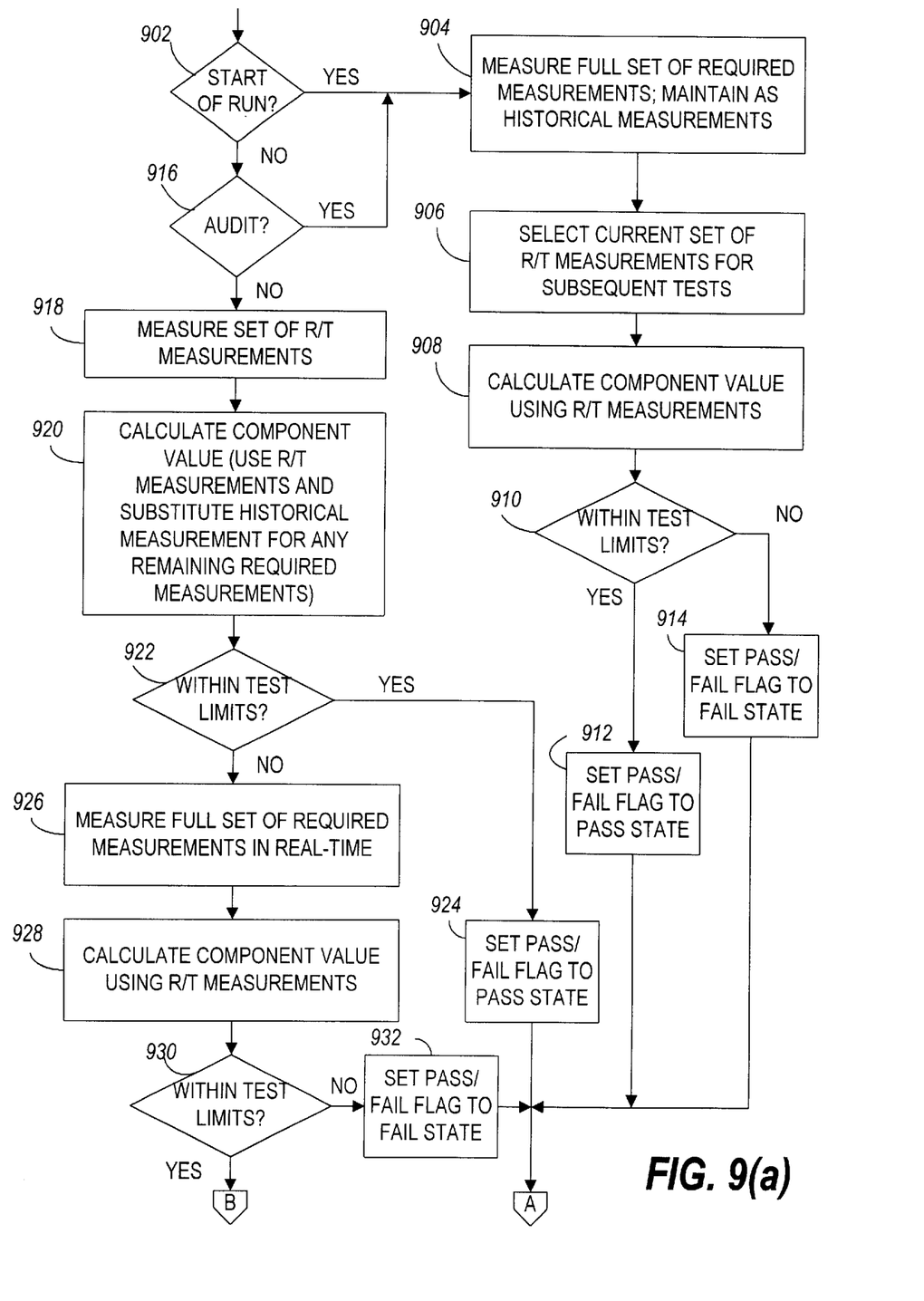
FIGS. 9(a) and 9(b) together illustrate a flowchart of an adaptive error source learning algorithm used in the illustrative example of the invention.
Figure 9B:
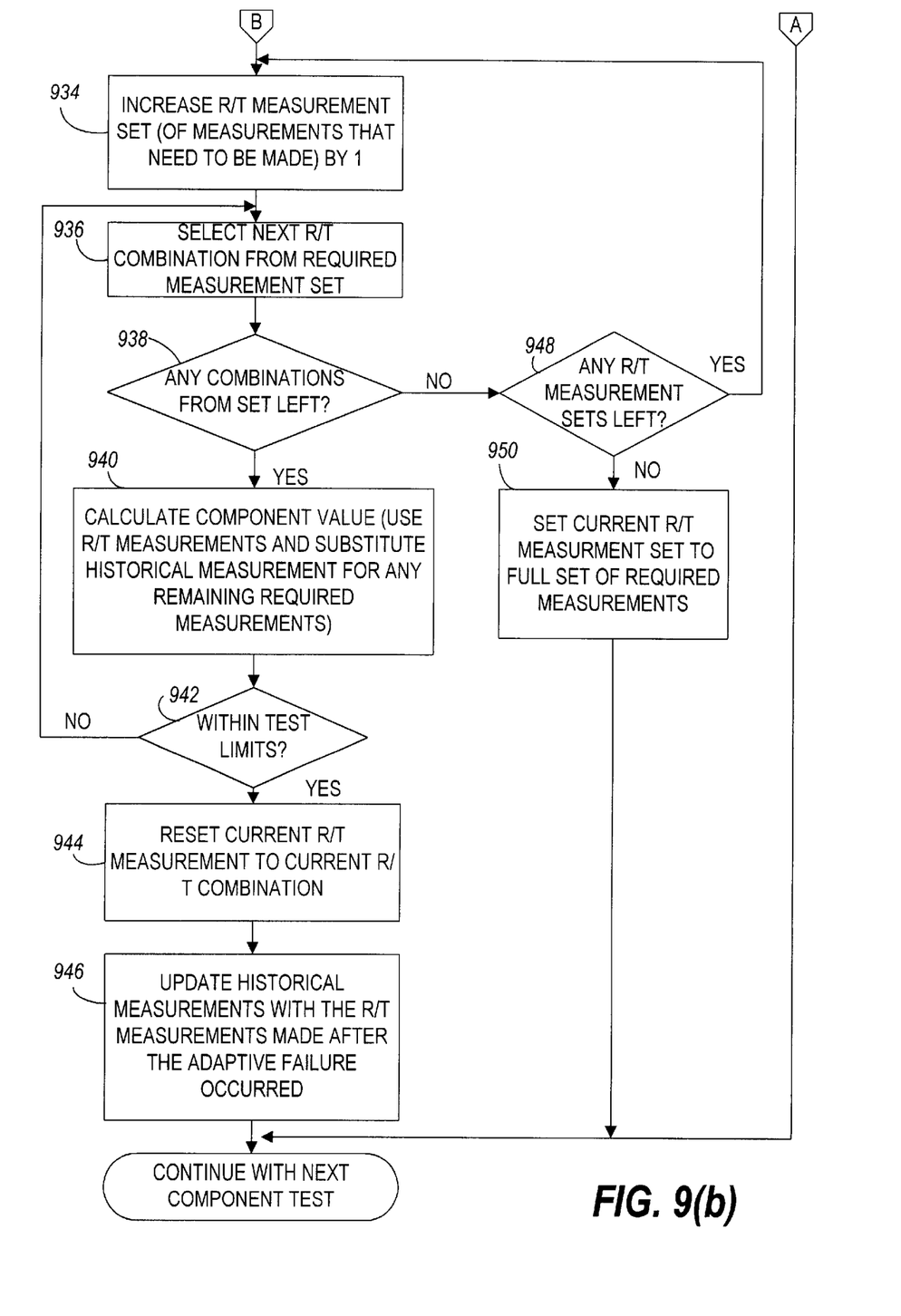

FIGS. 9(*a*) and 9(*b*) together comprise a flowchart of one embodiment of an adaptive error-source learning algorithm used by measurement combination processor 30 in determining the set of real-time measurements to take and in determining whether a component value as calculated by results analyzer 20 is a pass, a "false failure", or an actual failure. At start up of a run of PC boards, as determined in a step 902, a complete set of real-time measurements are obtained and saved 904 as historical measurements. Thus, any error in the calculated component value is known to be due to one or more error sources in the various measuring devices. Once a set of historical measurements are obtained, they are maintained, preferably via a fast access method such as in CPU registers or cache memory, for use by measurement combination processor 30. The measurement combination processor 30 selects 906 a current subset of real-time measurements to be obtained in future runs of the test. The selected current subset of real-time measurements is a subset of the complete set of measurements required by results analyzer 20 in calculating the component under test 108 value. Preferably, the current subset of real-time measurements is the minimum number of measurements that must be taken in real-time while substituting the historical measurement values of each other required measurement that will result in an accurate reflection of whether the component under test 108 passed when calculated by results analyzer 20. Various methods exist for determining which combination of the required measurements are to be measured in real-time and which are to be substituted with their corresponding historical measurement. Generally, the selection is based on test engineering experience and or theoretical test calculations. Preferably, the selected current subset of real-time measurements is the fewest number of measurements that accurately reflects that the component passes when the component value is calculated using the combination 32 of the subset of real-time measurements and historical measurement values for the remaining required measurements. In other words, the idea is to determine whether the component under test 108 is within passing specifications by taking the fewest number of measurements in real-time. For example, in any of the two-, three-, four-, and six-wire circuits 100, 200, 300 or 400, the subset of real-time measurements is preferably only the op-amp output value $V_o$ measured on output node 114.

The component under test 108 value is calculated 908 using the subset of real-time measurements, substituting the remaining required measurements with their corresponding historical measurements. A determination is made 910 as to whether the calculated component value is within specified test limits. If the calculated component value is within the test limits, the component under test 108 passes, and a pass/fail flag within the results analyzer 20 is set 912 to a "pass" state; if the calculated component value is not within passing tolerance, the pass/fail flag within the results analyzer 20 is set 914 to a "fail" state. The component test is then complete.

On subsequent runs of a component test, a determination is made 916 as to whether an audit, whereby the historical measurement values are updated, is required. In the preferred embodiment, an audit is performed after each period of a predetermined period of time, after a predetermined number of components have been tested, or after a predetermined number of successive passing components has been exceeded (e.g., limit of N=100 successive passing component tests). If an audit is required, steps 904 through 914 are repeated.

If an audit is not required, the current set of real-time measurements are obtained 918 for the component under test 108. The component under test 108 value is then calculated 920 using the current set of real-time measurements obtained in step 918 and substituting historical measurements obtained in step 904 for any required measurements not included in the current set of real-time measurements. A determination is made 922 as to whether the component under test 108 value is within predetermined specified test limits. If the component under test 108 value is within the limits, the pass/fail flag is set 924 to a "pass" state, and the test of that particular component under test 108 is complete. If the component under test 108 value is not within the test limits, each measurement required to calculate the component value is measured 926 in real-time and the component under test 108 value is calculated 928 using all of the real-time measurements. If again the component under test 108 value is not within the predetermined test limits, as determined in step 930, the pass/fail flag is set 932 to a "fail" state and the test of that particular component is complete.

If, after the retry on failure performed in steps 926 through 930, it is determined that the component under test 108 value is within the predetermined test limits, a "false failure" condition has been detected. In this case, the algorithm attempts to determine the next minimum set of real-time measurements that will result in the closest result when compared with the passing measurement value calculated using the complete set of real-time measurements 928. This is accomplished by increasing 934 the number of the real-time measurement set (i.e., the number of measurements that need to be made in real-time) by one. A next real-time measurement combination is selected 936 from the current real-time measurement set (e.g., all combinations of two measurements). Assuming that an untried combination from the current real-time measurement set exists, as determined in step 938, the component under test 108 value is calculated 940 using the real-time measurements from the combination chosen in step 936, and substituting historical measurement values for any required measurements not included in the selected combination. A determination is made 942 as to whether the calculated component under test 108 value is within the predetermined test limits. If so, the real-time measurements set that must be made to remove error sources is reset to the current combination of real-time measurements selected in step 936, and the historical measurements are updated 946 with the real-time measurements made after the adaptive failure occurred 926.

If in step 942 it is determined that the component under test 108 value is not within the predetermined test limits, a next real-time combination from the current real-time measurement set is selected 936 and steps 938 through 942 are repeated until a combination results in a passing test as determined in step 942, or no real-time combinations from the current set of real-time measurement set remain, as determined in step 938.

If there are no more combinations from the current real-time measurement set left to choose from, as determined in step 938, a determination is made 948 as to whether any more real-time measurement sets exist. If more real-time measurement sets do exist, steps 934 through 942 are repeated. If no more real-time measurement sets exist, the set of real-time measurements to take is set 950 to the complete set of required measurements.

The operation of the adaptive error-source learning algorithm of FIGS. 9(*a*) and 9(*b*) will become more clear from the following example. In this example, a four-wire test configuration circuit as shown in FIG. 4 is considered, in which the total number of measurements required to calculate the value of the component under test 108 is eight, including measurements of source sense node A 107, input sense node B 111, input node I 110, and output voltage $V_o$ 114, first with the power source $V_s$ 104 on (A, B, I, $V_o$) and then with the power source $V_s$ 104 off ($A_0$, $B_0$, $I_0$, $V_{oO}$). Generally, there are 256 possible combinations of all eight measurements; however, in this example, the number of combinations has been reduced, as shown in Table 1, to 23 possible realistic measurements. The combinations of required measurements is reduced based on a figure of merit developed by the test designers. The figure of merit may be based on experiment, previous testing results, theoretical calculations, and or experience of engineers in the industry. Accordingly, although up to 256 combinations of possible measurements may be made, the reduced number of subsets of those combinations in Table 1 represents a practical coverage of measurements in order to detect true failures of the component under test 108, in this case the connections and tolerances of a resistor. Table 1 is organized in order of priority and is partitioned into real-time measurement sets, as shown in the row labeled Relative Time, that require one, two, three, . . . , up to nine required real-time measurements. Within each real-time measurement set is a number of combinations of different measurements to take that fall within that set. For example, there is one combination within real-time measurement set #1, three combinations within real-time measurement set #2, four combinations within real-time measurement set #3, and so on. The source wait time whenever the voltage stimulus source $V_s$ 104 is turned off to take the source sense node A, input sense node B, input node I, and output voltage node $V_o$ measurements is considered a measurement time for use by the algorithm. For example, if the test using method 900 is in iteration 8, column 8 of Table 1 shows that output voltage $V_o$ is measured with power source $V_s$ 104 on and with power source $V_s$ 104 off $V_{oO}$. An additional time cycle is required to turn off the voltage stimulus source $V_s$, and therefore its relative measurement time is three cycles rather than two. As shown in Table 1, the additional time cycle is added to the relative time in each case where a measurement is required with power source $V_s$ 104 on and with power source $V_s$ 104 off.

TABLE 1

| Measurement Iteration | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| A |   | X |   |   | X | X |   |   | X | X |   |   | X | X |   | X |   |   | X | X | X |   | X |
| B |   |   | X |   | X |   | X |   | X |   | X |   | X |   | X |   | X |   | X | X |   | X | X |
| I |   |   |   | X |   | X | X |   | X |   |   | X |   | X | X |   |   | X | X |   | X | X | X |
| $V_o$ | X | X | X | X | X | X | X | X | X | X | X | X | X | X | X | X | X | X | X | X | X | X | X |
| $A_o$ |   |   |   |   |   |   |   |   |   |   |   |   |   |   |   | X |   |   |   | X | X |   | X |
| $B_o$ |   |   |   |   |   |   |   |   |   |   |   |   |   |   |   |   | X |   |   | X |   | X | X |
| $I_o$ |   |   |   |   |   |   |   |   |   |   |   |   |   |   |   |   |   | X |   |   | X | X | X |
| $V_{oO}$ |   |   |   |   |   |   |   | X |   | X | X | X | X | X | X | X | X | X | X | X | X | X | X |
| Relative Time (Real-Time Measurement Set Number) | 1 | 2 | 2 | 2 | 3 | 3 | 3 | 3 | 4 | 4 | 4 | 4 | 5 | 5 | 5 | 5 | 5 | 5 | 6 | 7 | 7 | 7 | 9 |

In the above example, using method 700 for determining combinations of real-time measurements to take and in determining whether a component value as calculated by results analyzer 20 is a pass, a "false" failure, or an actual failure, measurement combination processor 30 uses the sets in each column of Table 1, beginning with column "1" as the current set of real-time measurements to make. Thus, measurement combination processor 30 selects the first set of real-time measurements (step 702) to include only the output voltage $V_o$ with the power on. If, after measuring the output voltage $V_o$ in real-time (step 704), the calculated component value (steps 706 and 708) is not within the required passing tolerance, measurement combination processor 30 then increases the number of the real-time measurement set to set #2 contained in Table 1 as the next real-time measurement set. One of the three different combinations (shown in columns 2, 3 and 4 of Table 1) is selected (e.g., the combination in column 2) (step 710) from the current real-time measurement set. If the calculated component value results in a passing status, the selected combination is set (step 722) as the set of real-time measurements that must be obtained during subsequent runs of the test. If the calculated component under test 108 value results in a failing status, measurement combination processor 30 selects a different one (e.g., the combination in column 3) of the combinations from the current real-time measurement set (step 718) and the process is repeated. If all combinations have been exhausted the real-time measurement set is incremented to the next minimum set of measurements (e.g., set #3), and combinations are selected from that set until one of the combination passes or until all combinations have been exhausted. If all combinations have been exhausted, the process repeats until a combination from subsequent sets of real-time measurements results in a passing test or all combinations of all sets have been exhausted. If all combinations of all sets have been exhausted, then all the required measurements are taken in real-time and the set of real-time measurements is set to the maximum.

Table 2 is an example of a possible reduced set of measurement combinations for use in measuring an active component under test 108 such as a capacitor. The required measurements for calculating the component value includes the real, positive imaginary, and negative imaginary components of each of the source sense node A 107, input sense node B 111, input node I 110, and output node $V_o$ 114. Measurement combination processor 30 determines the initial set of real-time measurements to include those contained in column "1" of Table 2 (i.e., the positive imaginary component of output node $V_o$ 114). If the calculated component value does not result in a passing status, measurement combination processor 30 determines the next subset of required measurements to take in real-time to include those contained in column "2" of Table 2 (i.e., the real component on the source sense node A 107 and the positive imaginary component of output node $V_o$ 114). If the calculated component value again does not result in a passing status, measurement combination processor 30 iterates through each of columns 3 through 22 until the calculated component value does result in a passing status or the calculated component value still fails when calculated with all of the required measurements taken in real-time.

The invention can be used to adapt to the measurement wait times of the component under test 108. Each component under test 108 has a designated wait time associated with applying and removing the stimulus source $V_s$ 104 in order to allow the stimulus source time to reach its desired value. This time can be affected by the surrounding topology of the component under test 108. The wait times that are used are calculated based on worst case variances of the surrounding topology. These wait times can be adapted to the component under test 108 by measuring the component value and reducing the wait times to a point where the component under test 108 begins to fail. The wait times for that component under test 108 are then adjusted to that minimum value plus some margin for that particular component under test 108 for the current particular run of PC boards.

It is clear that the adaptively updated, combinations of historical and real-time measurements can be applied to the automated pass/fail testing of any tested parameter when that tested parameter is computed from other measured parameters normally measured for the purpose of determining if the value of the test parameter is within predetermined test limits.

Although the invention has been described in terms of the illustrative embodiments, it will be appreciated by those

TABLE 2

| Measurement Iteration | | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| B | +i | | | | | | | | | | | | | | | | X | X | | X | | X | X |
| | −1 | | | | | | | | | | | | | | | | | X | | X | | X | X |
| | R | | | | | | | | | | X | | X | X | | | X | X | | X | | X | X |
| A | +i | | | | | | | | X | | | | | | X | X | X | X | X | X | X | X | X |
| | −1 | | | | | | | | | | | | | | X | X | | X | X | X | X | X | |
| | R | | X | | | | X | X | X | X | X | X | X | X | X | X | X | X | X | X | X | X | X |
| I | +i | | | | | | | | | | | | | | | | X | | X | | X | X | X |
| | −1 | | | | | | | | | | | | | | | | | | X | | X | X | X |
| | R | | | | | | | | | | | X | X | X | | | X | | X | | X | X | X |
| $V_o$ | +i | X | X | X | X | X | X | X | X | X | X | X | X | X | X | X | X | X | X | X | X | X | X |
| | −1 | | | X | X | X | | | X | | | | | | X | X | | X | X | X | X | | |
| | R | | X | | X | | | X | X | X | X | | X | | X | X | | | | X | X | | X |
| Number of Measurements | | 1 | 2 | 2 | 2 | 3 | 3 | 3 | 4 | 4 | 4 | 4 | 4 | 5 | 5 | 6 | 8 | 8 | 8 | 9 | 9 | 11 | 12 |
| Equation | | 8 | 8 | 8 | 12 | 12 | 12 | 8 | 8 | 12 | 8 | 8 | 8 | 8 | 12 | 12 | 8 | 12 | 12 | 12 | 12 | 12 | 12 |

In the above example, the negative imaginary component of output voltage node $V_o$ 114 cannot be kept historically. Additionally, if the negative imaginary component −i is not required in real-time, then there is no DC offset and an additional level of throughput improvement can be made. This additional level of improvement is made by modifying the results analyzer 20 so that is does not require the DC offset calculation. The 12-measurement calculation can be reduced to an 8-measurement calculation using only the real R and positive imaginary +i components.

The audit function which updates the historical measurements after every successful consecutive n runs of the test (steps 916 followed by steps 904 through 914) is an optional feature for implementation in measurement processor 30. In an example implementation of the audit function, if the test is stable (i.e., no "false failures") for N=100 consecutive passing runs, then the results analyzer 20 algorithm automatically takes all required measurements again and updates the historical measurements with the re-measured measurements. Thus, the historical measurements are adapted to reflect updates in changes in the underlying measurement error sources.

skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for adaptively learning a set of real-time measurements to obtain in real-time during execution of an automated test, said method comprising the steps of:

measuring a current set of real-time measurements in real-time, said current set of real-time measurements comprising a subset of a full set of required measurements, each of said full set of required measurements being required to determine whether said test passed or failed;

obtaining a current set of historical measurements, said current set of historical measurements comprising corresponding historical measurement values for each of said required measurements that are not included in said current set of real-time measurements;

determining whether said test passed or failed based on said measured real-time measurements and said current set of historical measurements substituted for those required measurements that are not included in said current set of real-time measurements;

if said test fails:
choosing a current retry set of real-time measurements, said current retry set of real-time measurements comprising a subset of said required measurements different than said current set of real-time measurements;

measuring said current retry set of real-time measurements in real-time obtaining a current retry set of historical measurements, said current retry set of historical measurements comprising corresponding historical measurement values for each of said required measurements that are not included in said current retry set of real-time measurements; and redetermining whether said test passed or failed based on said current retry set of real-time measurements and said current retry set of historical measurements.

2. A method in accordance with claim 1, wherein:
said current retry set of real-time measurements comprises said full set of real-time measurements.

3. A method in accordance with claim 1, wherein:
if said test fails after said redetermining step:
choosing a next retry set of real-time measurements; and
repeating said second measuring step through said redetermining step using said next retry set of real-time measurements as said current retry set of real-time measurements.

4. A method in accordance with claim 3, wherein:
repeating said second measuring step, said second obtaining step, said redetermining step, said second choosing step, and said repeating step until said test passes or said current retry set of real-time measurements comprises said full set of required measurements.

5. A method in accordance with claim 1, wherein:
if said test passes after said redetermining step:
updating said corresponding historical measurement values of each of said current retry set of real-time measurements with said corresponding measured real-time measurements.

6. A method in accordance with claim 1, wherein:
if said test passes after said redetermining step:
setting said current set of real-time measurements to said current retry set of real-time measurements.

7. A method in accordance with claim 1, wherein:
if said test passes after said redetermining step:
determining a new set of real-time measurements; and
setting said current set of real-time measurements to said new set of real-time measurements.

8. A method in accordance with claim 7, wherein:
said determining step comprises:
selecting a reduced set of real-time measurements that result in said test passing, said reduced set of real-time measurements comprising a subset of said full set of required measurements.

9. A method in accordance with claim 8, wherein:
said selecting step comprises:
selecting a current reduced set of real-time measurements, said current reduced set of real-time measurements comprising a subset of said full set of required measurements;
measuring said current reduced set of real-time measurements in real-time;
obtaining a current set of historical measurements, said current set of historical measurements comprising corresponding historical measurement values for each of said required measurements that are not included in said current reduced set of real-time measurements;
determining whether said test passed or failed based on said measured reduced set of real-time measurements and said current set of historical measurements substituted for those required measurements that are not included in said current reduced set of real-time measurements;
if said test fails:
choosing a different reduced set of real-time measurements, said different reduced set of real-time measurements comprising a subset of said required measurements different that said current reduced set of real-time measurements;
substituting said current reduced set of real-time measurements with said different reduced set of real-time measurements;
repeating said measuring step through said determining step; and if said test passes:
replacing said current set of real-time measurements with said current reduced set of real-time measurements.

10. A method in accordance with claim 1, wherein:
periodically updating said current set of real-time measurements with a newly determined current set of real-time measurements.

11. A method in accordance with claim 10, wherein said updating step comprises:
selecting a current reduced set of real-time measurements, said current reduced set of real-time measurements comprising a subset of said full set of required measurements;
measuring said current reduced set of real-time measurements in real-time;
obtaining a current set of historical measurements, said current set of historical measurements comprising corresponding historical measurement values for each of said required measurements that are not included in said current reduced set of real-time measurements;
determining whether said test passed or failed based on said measured reduced set of real-time measurements and said current set of historical measurements substituted for those required measurements that are not included in said current reduced set of real-time measurements;
if said test fails:
choosing a different reduced set of real-time measurements, said different reduced set of real-time measurements comprising a subset of said required measurements different that said current reduced set of real-time measurements;
substituting said current reduced set of real-time measurements with said different reduced set of real-time measurements;
repeating said measuring step through said determining step; and if said test passes:
replacing said current set of real-time measurements with said current reduced set of real-time measurements.

12. A method for determining a reduced set of measurements to take in real-time when executing an automated test, said method comprising the steps of:

selecting a current reduced set of real-time measurements, said current reduced set of real-time measurements comprising a subset of a full set of required measurements, each of said full set of required measurements being required to determine whether said test passed or failed;

measuring said current reduced set of real-time measurements in real-time;

obtaining a current set of historical measurements, said current set of historical measurements comprising corresponding historical measurement values for each of said required measurements that are not included in said current reduced set of real-time measurements;

determining whether said test passed or failed based on said measured reduced set of real-time measurements and said current set of historical measurements substituted for those required measurements that are not included in said current reduced set of real-time measurements; if said test fails:

choosing a different reduced set of real-time measurements, said different reduced set of real-time measurements comprising a subset of said required measurements different that said current reduced set of real-time measurements;

substituting said current reduced set of real-time measurements with said different reduced set of real-time measurements;

repeating said measuring step through said determining step; and if said test passes:

using said current reduced set of real-time measurements as said reduced set of measurements to take in real-time when executing said automated test.

13. An automated testing system for testing a component under test, comprising:

a test configuration circuit that connects to said component under test and obtains a current set of real-time measurements; and a results analyzer which calculates a component value for said component under test using said current set of real-time measurements and substituting historical values for any required measurements that are not included in said real-time time measurements, determines whether said component value is within a pre-determined test limits, and signals a retry if said calculated component value is not within said pre-determined test limits;

a measurement combination processor which is responsive to said retry signal to select a current retry set of real-time measurements;

wherein said test configuration circuit obtains said current retry set of real-time measurements from said component under test and said results analyzer calculates a component value for said component under test using said current retry set of real-time measurements and substituting historical values for any required measurements that are not included in said current retry set of real-time measurements, and determines whether said component value is within said pre-determined test limits.

14. A system in accordance with claim 13, wherein:

if said calculated component value is not within said pre-determined test limits and said current set of real-time measurements does not comprise each of said required measurements, said measurement combination processor selects a next retry set of real-time measurements.

15. A system in accordance with claim 13, comprising:

a table comprising a plurality of subsets of said required measurements, each subset having an associated priority defining the order in which to use the subset as said current set of real-time measurements.

16. A system in accordance with claim 15, wherein:

said measurement combination processor selects a subset from said table, in order of said defined priority, as said current set of real-time measurements.

17. A system in accordance with claim 13, wherein:

said current set of real-time measurements comprises a fewest number of said required measurements which, when said historical values are substituted for any of said required measurements that are not included in said current set of real-time measurements, results in an accurate reflection of whether said calculated component value is within said pre-determined test limits; and said current retry set of real-time measurements comprises a next fewest number of said required measurements which, when said historical values are substituted for any of said required measurements that are not included in said current retry set of real-time measurements, results in an accurate reflection of whether said calculated component value is within said pre-determined test limits.

18. A system in accordance with claim 13, wherein:

said current retry set of real-time measurements comprises all of said required measurements.

19. A system in accordance with claim 13, comprising:

an audit function which periodically remeasures at least one of said required measurements in real-time and replaces said historical values with said corresponding remeasured required measurements.

20. A system in accordance with claim 19, wherein:

said audit function is performed after a pre-determined number of passing tests.

* * * * *